(12) United States Patent
Chiba

(10) Patent No.: US 7,937,650 B2
(45) Date of Patent: May 3, 2011

(54) MAXIMUM LIKELIHOOD DECODER AND DECODING METHOD THEREFOR

(75) Inventor: Norikatsu Chiba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 12/478,272

(22) Filed: Jun. 4, 2009

(65) Prior Publication Data

US 2009/0319876 A1 Dec. 24, 2009

(30) Foreign Application Priority Data

Jun. 24, 2008 (JP) ................................. 2008-164946

(51) Int. Cl.
*H03M 13/03* (2006.01)
(52) U.S. Cl. ...................... 714/796; 714/794; 369/59.22
(58) Field of Classification Search .................. 714/794, 714/796; 369/59.22
See application file for complete search history.

(56) References Cited

U.S. PATENT DOCUMENTS

| | | | | |
|---|---|---|---|---|
| 4,788,694 | A * | 11/1988 | Calderbank | 375/295 |
| 5,418,795 | A * | 5/1995 | Itakura et al. | 714/746 |
| 5,878,092 | A * | 3/1999 | Choi | 375/341 |
| 5,907,586 | A * | 5/1999 | Katsuragawa et al. | 375/341 |
| 6,963,528 | B2 | 11/2005 | Ogura | |
| 7,212,476 | B2 | 5/2007 | Ogura | |
| 7,274,645 | B2 | 9/2007 | Urita | |
| 2005/0283629 | A1* | 12/2005 | Tanaka et al. | 713/322 |
| 2008/0209305 | A1* | 8/2008 | Sato | 714/790 |

FOREIGN PATENT DOCUMENTS

| | | |
|---|---|---|
| JP | 08-212716 | 8/1996 |
| JP | 2002-208219 | 7/2002 |
| JP | 2002-269925 | 9/2002 |
| JP | 2006-4465 | 1/2006 |
| JP | 2007-273016 | 10/2007 |
| JP | 2008-010097 | 1/2008 |
| JP | 2008-112543 | 5/2008 |

OTHER PUBLICATIONS

Black et al., "A 140-Mb/s, 32-State, Radix-4 Viterbi Decoder", IEEE Journal of Solid-State Circuits, vol. 27, No. 12, pp. 1877-1885, (1992).
Yeung et al., "A 210Mb/s Radix-4 Bit-Level Pipeline Viterbi Decoder", IEEE International Solid-State Circuits Conference, pp. 88-89, (1995).
Choi, "Reconfigurable Front-End System for BD/DVD/CD Recorder", IEEE Transactions on Consumer Electronics, vol. 53, No. 2, pp. 474-480, (2007).

(Continued)

*Primary Examiner* — M. Mujtaba K Chaudry
(74) *Attorney, Agent, or Firm* — Finnegan, Henderson, Farabow, Garrett & Dunner, L.L.P.

(57) ABSTRACT

According to one embodiment, a maximum likelihood decoder includes a branch metric calculator, a processor configured to perform addition, comparison, and selection of an output from the branch metric calculator and a path metric memory, and outputs a selection signal for identifying a selection result, a path memory configured to store a time variation of the selection signal, and a path detection module configured to detect a decoding signal based on the time variation of the stored selection signal. A decoding method includes selecting operation modes of at least one of the branch metric calculator, the processor, and the path memory between a first operation mode in which an operation is performed at a channel rate frequency and a second operation mode in which an operation is performed at a specific frequency lower than the channel rate frequency.

12 Claims, 13 Drawing Sheets

OTHER PUBLICATIONS

Final Notice of Reason for Rejection mailed May 25, 2010, from the Japanese Patent Office for Japanese Patent Application No. 2008-164946 (2 pages).

Final Notice of Reason for Rejection mailed Feb. 23, 2010, from the Japanese Patent Office for Japanese Patent Application No. 2008-164946 (4 pages).

Notice of Reason for Rejection mailed Nov. 24, 2009, from the Japanese Patent Office for Japanese Patent Application No. 2008-164946 (3 pages).

Notice of Reason for Rejection mailed Aug. 11, 2009, from the Japanese Patent Office for Japanese Patent Application No. 2008-164946 (2 pages).

* cited by examiner

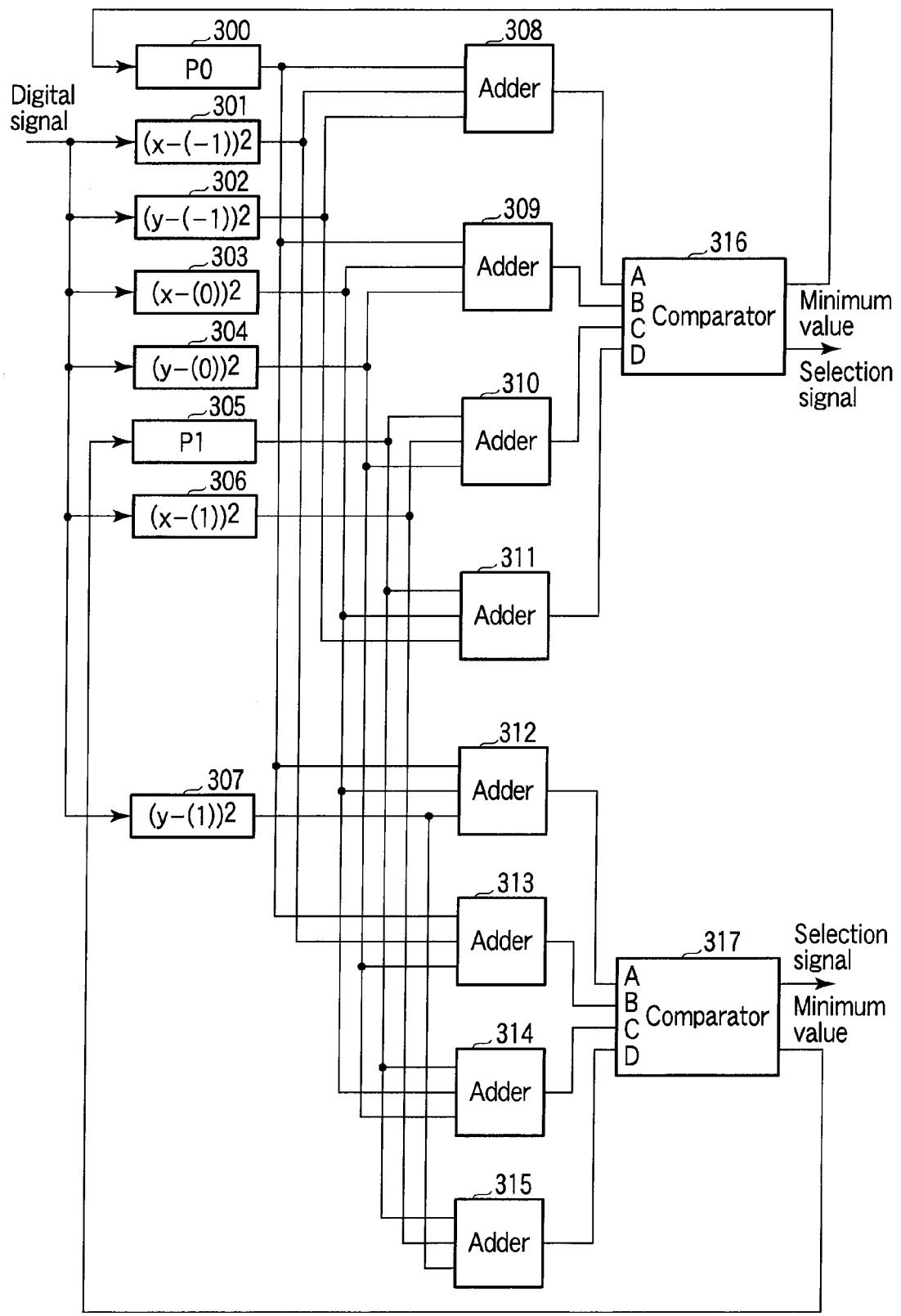
F I G. 7

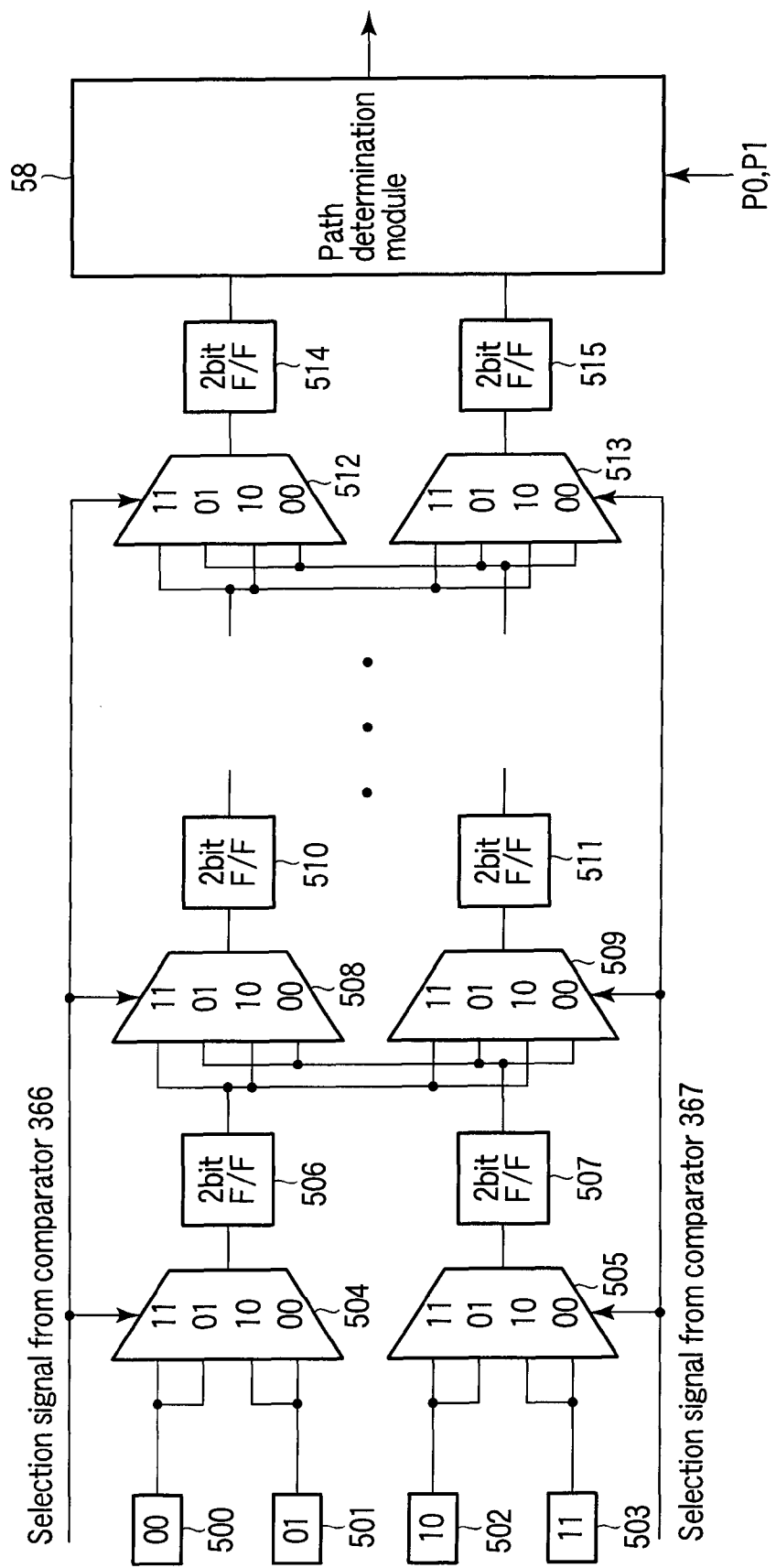
F I G. 13

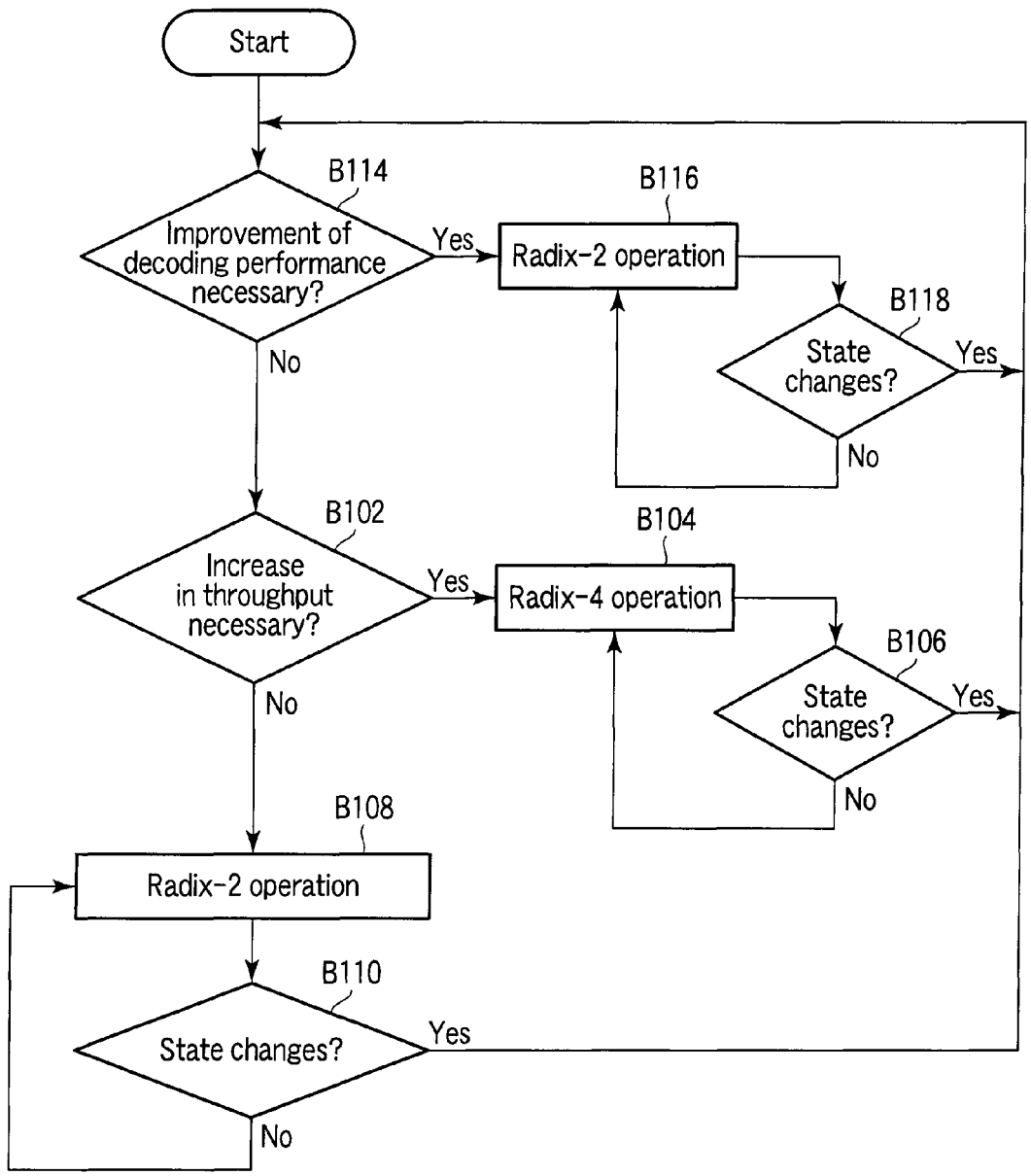
F I G. 16

MAXIMUM LIKELIHOOD DECODER AND DECODING METHOD THEREFOR

CROSS-REFERENCE TO RELATED APPLICATIONS

This application is based upon and claims the benefit of priority from Japanese Patent Application No. 2008-164946, filed Jun. 24, 2008, the entire contents of which are incorporated herein by reference.

BACKGROUND

1. Field

One embodiment of the invention relates to a maximum likelihood and a decoding method therefor used in an optical disk device which reproduces information on an optical disk, a hard disk device which reproduces information on a hard disk, a communication apparatus which reproduces received information received from a communication/transmission path, and the like.

2. Description of the Related Art

In recent years, optical disk devices such as a DVD (Digital Versatile Disk) player have been widely popularized. Various schemes have been researched and developed, and commercially manufactured. In particular, also in the field of optical recording/reproduction, high-density recording is advanced, and a linear recording density considerably increases. Furthermore, a laser wavelength becomes short, and a numerical aperture of a lens increases. For this reason, the quality of the reproduced signal quality is greatly reduced due to tilt. Therefore, as a countermeasure against this drawback, a PRML (Partial Response and Maximum Likelihood) signal processing scheme is popularly applied.

In a conventional DVD system, a binarizing scheme for a reproduced signal, a waveform slice scheme is employed. In the waveform slice scheme, binarization is performed depending on whether an amplitude of a reproduced signal is higher or lower than a threshold value. However, since the amplitude of the reproduced signal decreases due to high-density recording, a large number of identifying errors occur in the binarization performed by the waveform slice. It is known that the PRML signal processing scheme can obtain a higher signal quality than that in a conventional level slice scheme, even in information recorded on an optical disk at a high density, therefore, the PRML signal processing scheme is also applied to an optical disk device using a blue laser beam.

In the PRML signal processing scheme, through an equalizer, an input signal is supplied to a Viterbi decoder, and a decoding signal is output from the Viterbi decoder. An equalization error signal generated by an input signal and a decoding signal is also supplied to a coefficient controller, and a coefficient of an equalizer is learning-controlled. The Viterbi decoder cumulatively sums errors between actual input signals at sample points and all supposed paths and selects a path having a minimum cumulative sum. A bit string corresponding to the selected path is output as a decoding signal.

With an increase in required multi-speed of reproduction or required data rate, a maximum likelihood decoder is required to achieve a high throughput. Since a throughput is in proportion to an operating frequency of a circuit, it may be considered to increase the operating frequency to increase the throughput. However, in a maximum likelihood decoder, branch metrics are calculated, and calculations for addition, comparison, and selection between the branch metrics and path metrics must be performed at a high speed. For this reason, even though the operating frequency is merely increased, the throughput cannot be easily increased. Therefore, as described in document 1 "A 140-Mb/s, 32-State, Radix-4 Viterbi Decoder," P. J. Black, et al., IEEE JSSC, Vol. 27, No. 12, December 1992, pp 1877-1885 and document 2 "A 210 Mb/s Radix-4 Bit-level Pipelined Viterbi Decoder," A. K. Yeung, J. M. Rabaey, ISSCC 1995, pp 88-89, 344, Table 1, a method called radix-4 in which the number of elements of an ACS (Addition, Comparison, Selection) calculation circuit is increased by applying the graph algorithm to decrease the operating rate of the circuit to ½ while keeping a throughput is proposed.

In order to cope with a Blu-ray disk (trademark) which is required to achieve a higher throughput, a maximum likelihood decoder using a method called Radix-16 which further reduces (⅛) an operating speed is reported in document 3 "Reconfigurable Front-End System For BD/DVD/CD Recorder," G. S. Choi, IEEE Transactions on Consumer Electronics, Vol. 53, No. 2, May 2007, pp 474-480.

However, although an operating speed can be reduced in the radix-4 or radix-16, an ACS circuit scale disadvantageously increases. Comparison between radix-2 and the radix-4 is shown in Table 1 of document 2. In contrast to a throughput of 50 Mbps in the radix-2, a throughput increases to 140 Mbps in the radix-4. However, in the radix-4, an area of an ACS circuit also increases from 7.1 mm$^2$ (design rule is 2.0 μm) to 33.6 mm$^2$ (design rule is 1.2 μm).

In general, a semiconductor inevitably has a leakage current, a leakage current generated due to only the presence of a circuit of 90-nm generation, 65-nm generation, or later the micropatterning of which advances cannot be neglected.

In listening to music on a CD or in viewing of a moving image on a DVD by using a maximum likelihood decoder using the radix-4 or radix-16 to reduce an operating speed as described above, electric power may be consumed in an arithmetic unit or a storage unit having a circuit scale which increases regardless of a low required throughput. Even in reproduction of disks of the same type, the disks may be reproduced at various speeds depending on the states of the disks, and required throughputs may change. The change in throughput may occur in not only reproduction of an optical disk but also a maximum likelihood decoder used in a hard disk device in which data is reproduced at a dual speed (rotating speed changes) or a communication system. More specifically, in a low-throughput state with which a radix-2 circuit can normally cope, the arithmetic unit or the storage unit the scale of which increases is consequently useless. Electric power is therefore also consumed even in this useless circuit.

Various countermeasures which reduce the power consumption in a decoding apparatus operating at a high speed are described in Jpn. Pat. Appln. KOKAI Publication Nos. 2007-273016 (FIG. 1) and 2006-4465 (FIG. 1). However, none of the countermeasures can realize an appropriate compromise between throughput and power consumption.

On the other hand, in the radix-4, 2-bit data must be simultaneously input to an ACS circuit to reduce an operating frequency by half. For this reason, 1-bit serial data must be converted into 2-bit serial data by using a serial/parallel converter such as a flop-flop, a latency in a circuit increases, and a response speed of the circuit decreases. As described above, an equalization error signal is supplied to a coefficient controller, and a coefficient of an equalizer is feedback-controlled. When the waveform of data is shaped, decoding performance is not influenced even though a response speed is low. However, when the waveform of data considerably changes due to scratches and stains on a disk, decoding performance is deteriorated with an increase in latency. In this manner, when a high throughput is realized, decoding performance is deteriorated.

As described above, in a conventional maximum likelihood decoder which is increased in circuit scale to realize a high throughput, the electric power consumed in arithmetic units the number of which increases cannot be neglected at a low throughput, and a problem is posed in terms of power consumption. Another problem is also posed in that, in order to realize a high throughput, a latency increases and decoding performance is deteriorated.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 7 is an exemplary block diagram showing the configuration of a radix-4 branch metric calculator, addition/comparison/selection circuits, and a path metric memory.

FIG. 13 is an exemplary block diagram showing the configuration of a path memory when the radix-4 mode is an on state.

FIG. 16 is an exemplary flow chart showing an ON/OFF switching operation in the radix-4 mode.

DETAILED DESCRIPTION

Various embodiments according to the invention will be described hereinafter with reference to the accompanying drawings. In general, according to one embodiment of the invention, a decoding method for a maximum likelihood decoder comprising a branch metric calculator configured to calculate a branch metric; a processor configured to perform addition, comparison, and selection of an output from the branch metric calculator and a path metric to update the path metric, and outputs a selection signal for identifying a selection result; a path memory configured to store a time variation of the selection signal; and a path detection module configured to detect a decoding signal based on the time variation of the selection signal stored in the path memory, the method comprises selecting operation modes of at least one of the branch metric calculator, the processor, and the path memory switch between a first operation mode in which an operation is performed at a channel rate frequency and a second operation mode in which an operation is performed at a specific frequency lower than the channel rate frequency.

A maximum likelihood technique such as Viterbi decoding used in a radio communication or a hard disk drive has also been used in an optical disk. In a DVD, although not been defined as a standard, by using a maximum likelihood decoding technique based on a PR class such as a PR (1, 2, 2, 1) or a PR (3, 4, 4, 3), decoding having an accuracy higher than that of conventional decoding performed by a threshold value and high robustness is performed. An optical disk system such as a Blu-ray disk system using a blue laser is also based on maximum likelihood decoding being used for data decoding.

Figure 1:
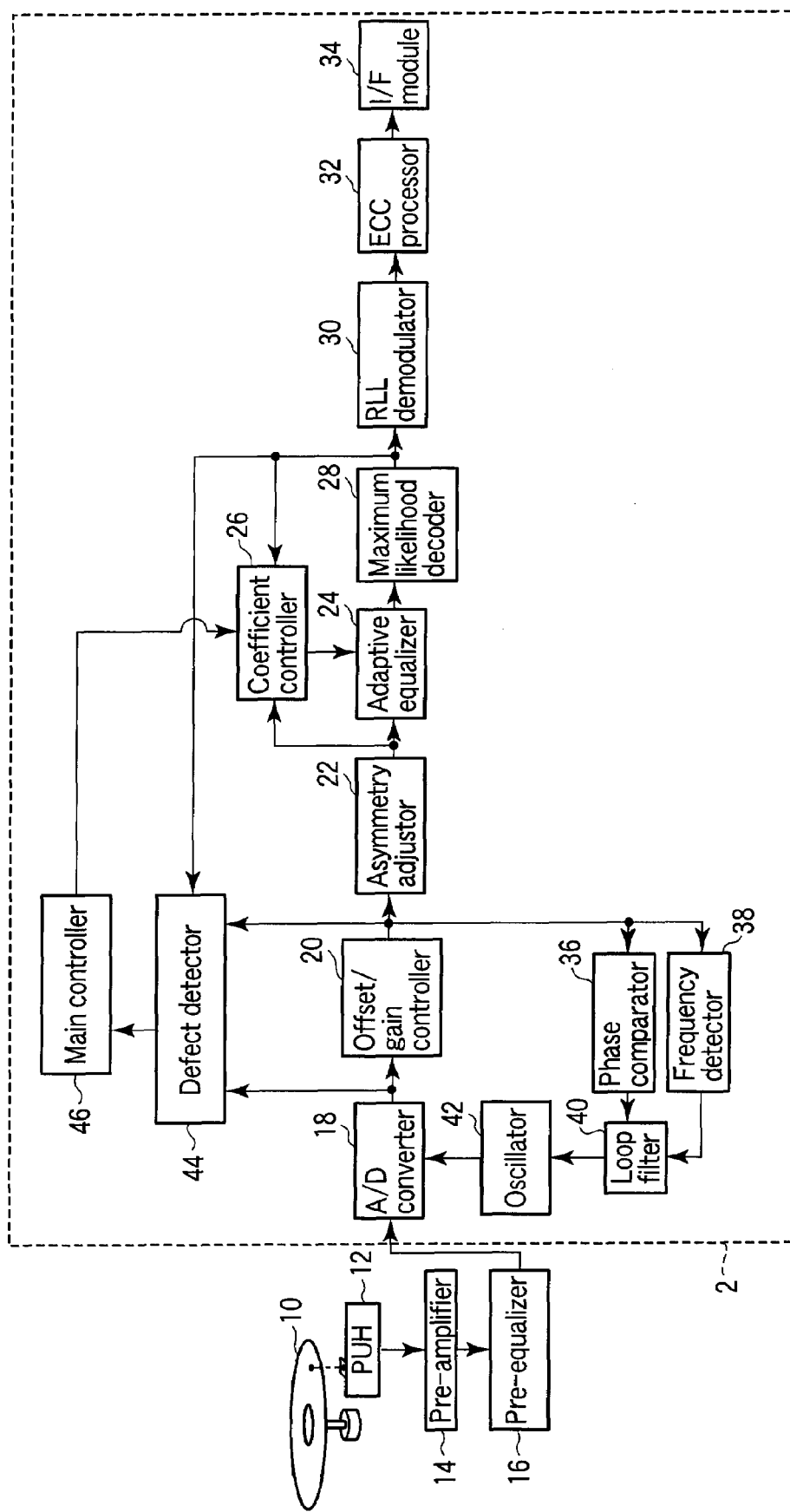
FIG. 1 is an exemplary block diagram showing a configuration of an optical disk device according to an embodiment of the present invention.

A configuration of an optical disk device according to an embodiment of the invention is shown in FIG. 1. An optical pickup head (PUH) 12 which irradiates a laser beam on a medium, for example, an optical disk 10 such as a DVD (Digital Versatile Disk) or a BD (Blu-ray Disk) on which data is to be recorded or from which data is to be reproduced, receives a reflected beam, and outputs a read signal is arranged. A reproduced signal of a weak analog signal read by the optical pickup head 12 is amplified by a pre-amplifier 14. The amplified reproduced signal is subjected to a filter process by a pre-equalizer 16, and appropriate bandwidth limiting and waveform shaping as needed are performed. An output signal from the pre-equalizer 16 is A/D-converted by an A/D converter 18. An offset/gain of an output from the A/D converter 18 is controlled by an offset/gain controller 20.

A clock is extracted from a reproduced waveform itself with respect to generation of a reproduced clock input to the A/D converter 18. For this reason, an output from the offset/gain controller 20 is supplied to a phase comparator 36 and a frequency comparator 38, a frequency error between a reproduced waveform and a signal frequency is detected by the frequency comparator 38, and a phase error between the reproduced waveform and an ideal sampling point is detected by the phase comparator 36. Control on the basis of the frequency error and the phase error is known as PLL (Phase Locked Loop) control, and both frequency control and phase control are performed by the same loop filter 40, and the clock is supplied to the A/D converter 18 by a VCO (Voltage Controlled Oscillator) 42. An integrator is generally used as the loop filter 40. An output clock from the VCO 42 is also supplied to other circuits to perform timing control.

An output from the offset/gain controller 20 is asymmetrically corrected by an asymmetry adjustor 22 and then supplied to an adaptive equalizer 24. The optical disk device according to the embodiment employs a PRML (Partial Response and Maximum Likelihood) scheme as a binarization scheme. For example, a recording/reproduction system is assumed as a PR (h0, h1, h2, h3) characteristic. Reference symbols in the parentheses denote an impulse response sequence. More specifically, a sample value of a reproduced signal for a recording bit "1" appears as a sequence having amplitudes expressed by h0, h1, h2, and h3, while 0 is obtained at sample points outside the sequence.

The adaptive equalizer 24 is configured by an FIR (Finite Impulse Response) filter which matches (waveform equalization) to the PR characteristic which uses a reproduced signal of the optical disk 10. When the PR characteristic similar to a reproduced signal characteristic of the optical disk 10 is selected, a noise component is suppressed from being amplified by equalization.

As described above, the adaptive equalizer 24 equalizes the waveform of the reproduced signal into a response waveform (partial response waveform signal) depending a target PR characteristic (PR class). The equalization characteristic (coefficient of the FIR filter) obtained at this time is adjusted by the coefficient controller 26.

An output from the adaptive equalizer 24 is supplied to the maximum likelihood decoder (Viterbi decoder) 28. The details of the maximum likelihood decoder 28 will be described later.

A decoding result of the maximum likelihood decoder 28 is also supplied to the coefficient controller 26 and a defect detector 44. The coefficient controller 26 optimizes an equalization coefficient (tap coefficient) of the adaptive equalizer 24 on the basis of a reproduced signal output from the asymmetry adjustor 22 and an identification signal output from the maximum likelihood decoder 28.

An optimizing method includes various algorithms. As an example, an adaptive learning method called an LMS (Least Mean Square) algorithm is known. According to this learning method, an equalization error signal for a target equalization characteristic is generated from an output result of the maximum likelihood decoder 28, and a tap coefficient value is updated such that a square average of the equalization error signal is minimized.

The defect detector 44 which detects a defect of an optical disk depending on an output from the A/D converter 18, an output from the offset/gain controller 20, and an output from the maximum likelihood decoder 28 is arranged. A detection result from the defect detector 44 is supplied to a main controller 46. The main controller 46 controls operations of the coefficient controller 26 and other blocks.

Circuits other than the PUH 12, the pre-amplifier 14, and the pre-equalizer 16 are integrated in one semiconductor chip (controller for optical disk device) 2. The respective blocks are controlled through the main controller 46.

Figure 2:
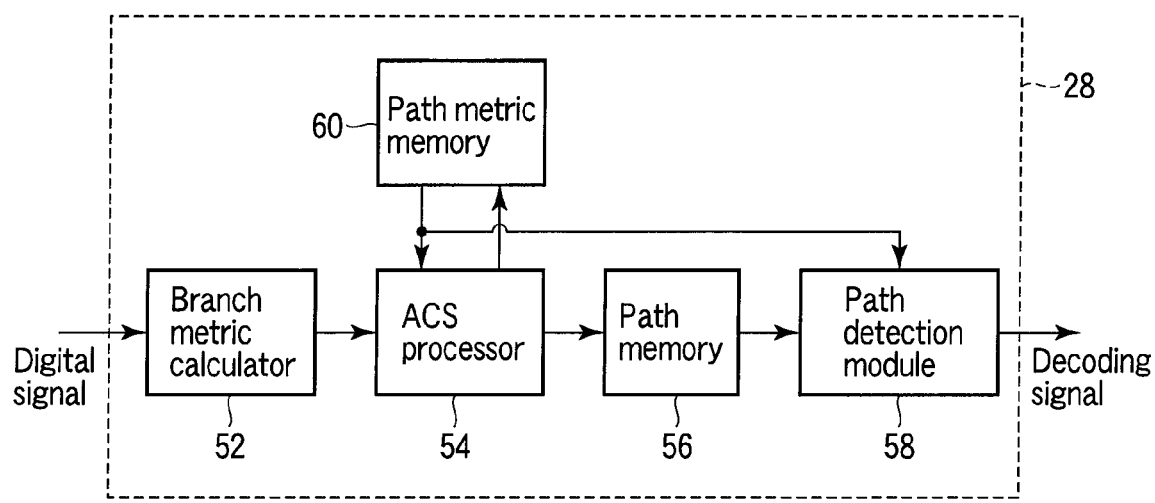
FIG. 2 is an exemplary block diagram showing details of a maximum likelihood decoder 28 in FIG. 1.

FIG. 2 shows a configuration diagram of the maximum likelihood decoder 28. FIG. 2 shows the configuration of a general Viterbi decoding circuit. The maximum likelihood decoder 28 includes a branch metric calculator 52, an addition/comparison/selection (ACS) circuit 54, a path memory 56, a path detection module 58, and a path metric memory 60. The branch metric calculator 52 performs branch metric calculation by using an input from the adaptive equalizer 24. The addition/comparison/selection (ACS) circuit 54 performs addition, comparison, and selection between outputs from the branch metric calculator 52 and path metrics stored in the path metric memory 60 to detect a path and a path metric. The path memory 56 stores a process of selection of a path. On the basis of the stored selection result, the path detection module 58 detects a final decoding signal and outputs the signal.

With an increase in the required multi-speed or data rate, the maximum likelihood decoder is also required to have a high throughput. However, as explained in the background art, the maximum likelihood decoder cannot easily cope with the high throughput by simply increasing its operating frequency. There is a method called radix-4 which reduces an operating speed of a circuit while maintaining a throughput. This method may decrease the decoding performance. Recently, a reduction in power consumption of a product to be provided is considerably emphasized. In order to cope with this request, the present invention provides a method which reduces the number of arithmetic units and storage units to be used in a low-throughput state to reduce a power consumption although an operating frequency decreases in a high-throughput state.

First, the radix-4 will be described. A simplified explanation of a PR (1,1) class will be given below. The invention is, however, not limited to the PR (1,1) class, and can cope with all PR classes.

Figure 3:
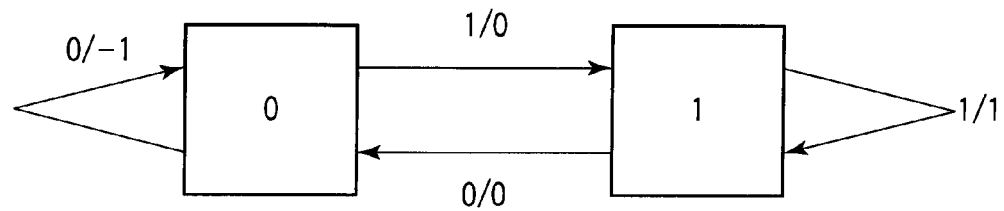
FIG. 3 shows exemplary state transition diagrams of a PR (1,1).

FIG. 3 shows state transition diagrams of a PR (1,1). In the PR (1,1), an output value is determined such that current input data and input data input at a previous time interact with each other. A number added to the left side of an arrow denotes expected decoding data, i.e., data actually recorded on the optical disk 10, and a number added to the right denotes an output value expected by the PR (1,1). A decoding signal is set in two states, i.e., 0 and 1. However, three output values 0, 1, and −1 are expected due to an influence of temporally adjacent data. Numbers in squares denote immediately previous decoding data. Transitions to decoding data "0" include two transitions, i.e., a transition obtained when the immediately previous decoding data, recording data, and an expected output value are "0", "0", and "−1", respectively, and a transition obtained when the immediately previous decoding data, the recording data, and the expected output value are "1", "0", and "0" respectively. Transitions to the decoding data "1" include two transitions, i.e., a transition obtained when the immediately previous decoding data, the recording data, and the expected output value are "0", "1", and "0", respectively, and a transition obtained when the immediately previous decoding data, the recording data, and the expected output value are "1", "1", and "1", respectively.

Figure 4:
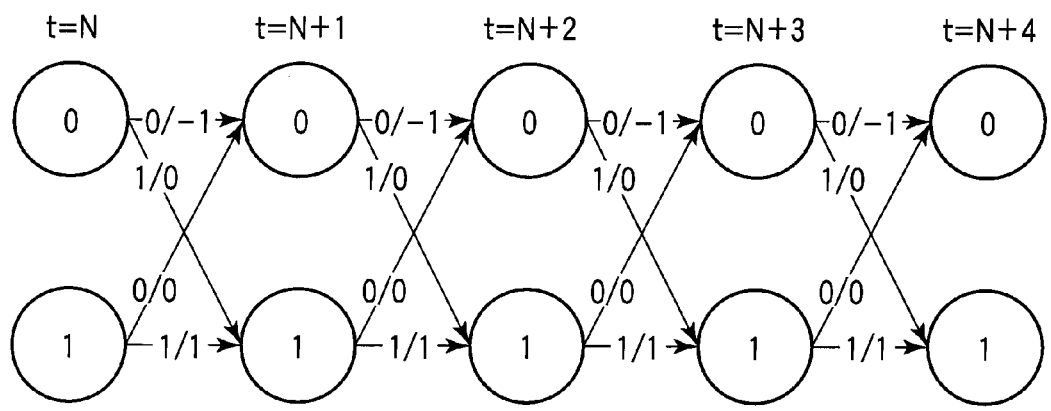
FIG. 4 is an exemplary trellis graph of the PR (1,1).

FIG. 4 is a trellis graph obtained by connecting the state transition diagrams in FIG. 3 to each other in a time series manner.

Figure 5:
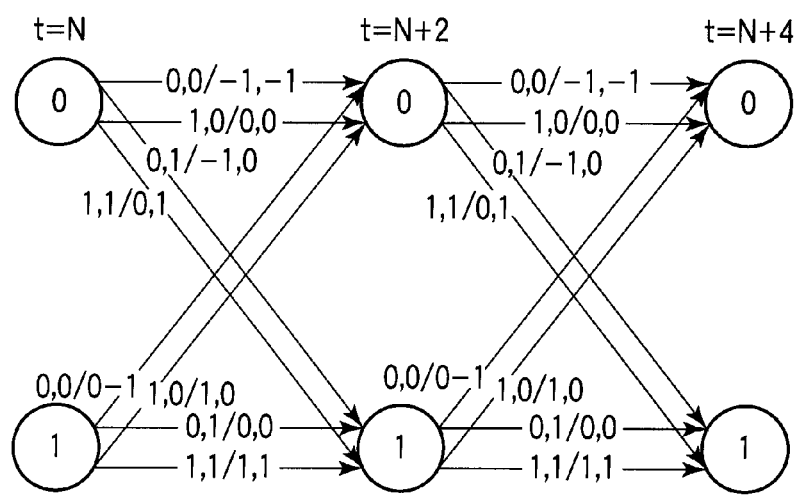
FIG. 5 is an exemplary trellis graph of a radix-4 PR (1,1).

FIG. 5 is a trellis graph of a radix-4 PR (1,1). The trellis graph in FIG. 4 which is not subjected to radix-4 is also called radix-2. In FIGS. 4 and 5, t=N or the like denotes time, and means a manner in which time elapses to the right. Numbers added to arrows have the same meanings as those in FIG. 3. Numbers in circles have the same meanings as those in the squares in FIG. 3. Viterbi decoding is a method which compares input data with an expected output value according to the trellis graphs and outputs a maximum likelihood output value as a decoding result.

As described in the document 1 "A 140-Mb/s, 32-State, Radix-4 Viterbi Decoder", the radix-4 is a method of increasing the number of calculations performed for a constant period of time from 4 to twice as much, i.e., 8 but doubling a period of time which is taken for calculations to make an operating frequency ½. As is apparent from comparison between FIGS. 4 and 5, the operating frequency of the radix-4 becomes half the operating frequency of the radix-2. As a result, a period of time which can be taken for one calculation is doubled. Alternatively, an amount of branch metric calculation and an amount of ACS calculation per time unit are increased.

Figure 6:
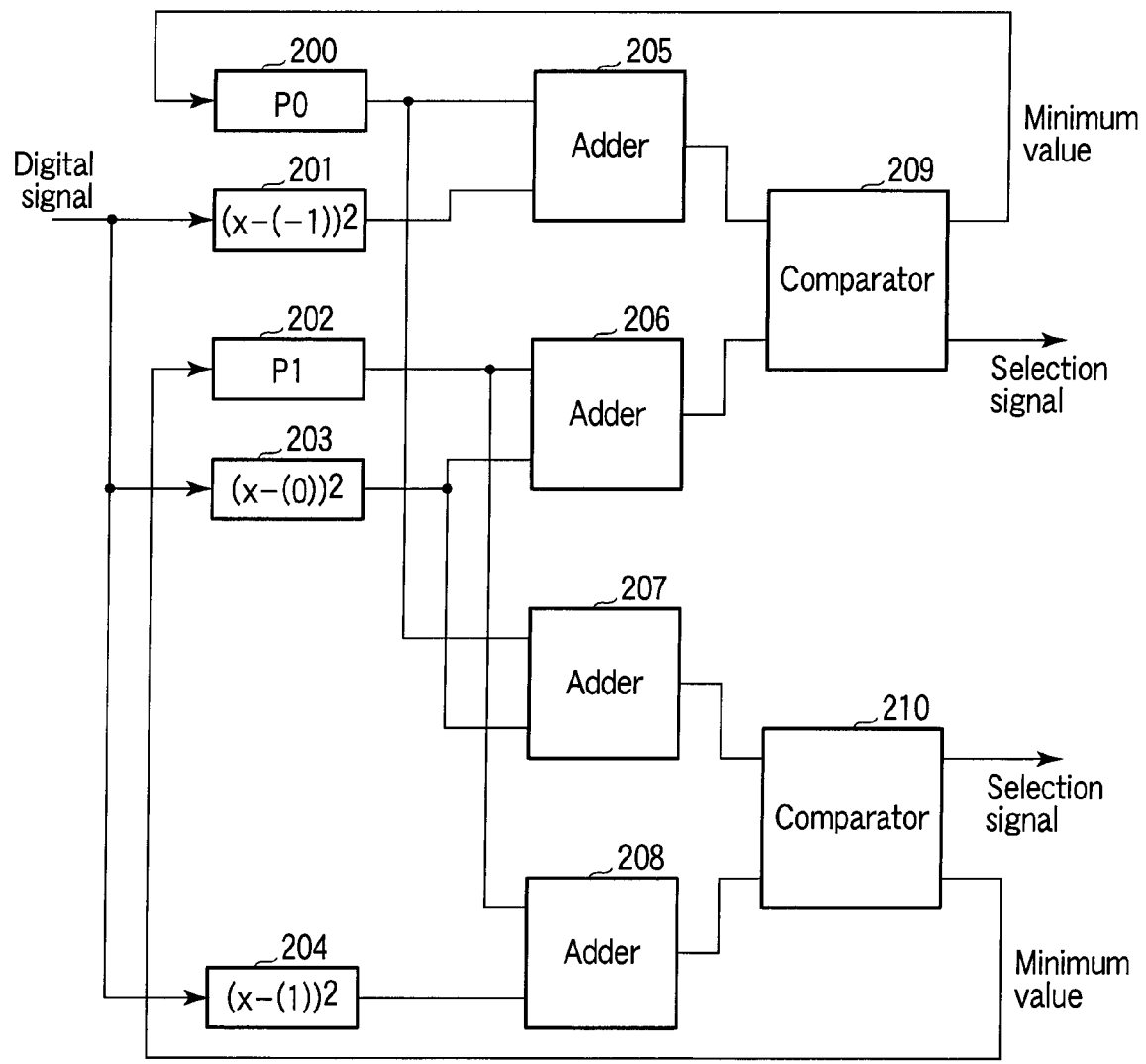
FIG. 6 is an exemplary block diagram showing the configuration of a radix-2 branch metric calculator, addition/comparison/selection circuits, and a path metric memory.

Examples of the branch metric calculator 52, the ACS calculator 54, and the path metric memory 60 in the radix-2 are shown in FIG. 6. As the branch metric calculator 52 to which a digital signal from the adaptive equalizer 24 is supplied, branch metric calculators 201, 203, and 204 are arranged, and branch metrics (squared to obtain absolute values) $(x-(-1))^2$, $(x-(0))^2$, and $(x-(1))^2$ between an input signal x and expected output values −1, 0, and +1 are calculated. As the path metric memory 60, path metric memories 200 and 202 are arranged. Minimum values detected by comparators 209 and 210 are stored as path metrics P0 and P1, respectively.

An output from any one of the branch metric calculators 201, 203, and 204 and an output from any one of path metric memories 200 and 202 are added to each other in adders 205, 206, 207, and 208. Outputs from the adders 205 and 206 are compared with each other in the comparator 209 to detect a minimum value. A 1-bit selection signal (index signal) which identifies a selection result representing a minimum one of the two inputs of the comparator 209 is output to the path memory 56. Outputs from the adders 207 and 208 are compared with each other in the comparator 210 to detect a minimum value. A 1-bit selection signal (index signal) which identifies a selection result representing a minimum one of the two inputs of the comparator 210 is output to the path memory 56.

The minimum value output from the comparator 209 is written in the path metric memory 200 as the path metric P0. The minimum value output from the comparator 210 is written in the path metric memory 202 as the path metric P1.

When a digital signal obtained when t=N is represented by $x_N$, and when path metrics related to "0" and "1" are represented by $P0_N$ and $P1_N$, respectively, a path metric $P0_{N+1}$ obtained when t=N+1 is a minimum one of the following values and selected by the comparator 209.

$(x_N-(-1))^2+P0_N$ $(x_N-0)^2+P1_N$

Similarly, a path metric $P1_{N+1}$ obtained when t=N+1 is a minimum one of the following values and selected by the comparator 210.

$(x_N-0)^2+P0_N$ $(x_N-1)^2+P1_N$

Examples of the branch metric calculator 52, the ACS calculator 54, and the path metric memory 60 in the radix-4 are shown in FIG. 7. As the branch metric calculator 52 to which a digital signal from the adaptive equalizer 24 is supplied, branch metric calculators 301, 302, 303, 304, 306, and 307 are arranged. Differences (squared to obtain absolute values) $(x-(-1))^2$, $(x-(0))^2$, $(x-(1))^2$, $(y-(-1))^2$, $(y-(0))^2$, and $(y-(1))^2$ between x and y of 2-bit input signals x and y and expected output values −1, 0, and +1 are calculated. As the path metric memory 60, path metric memories 300 and 305 are arranged, and minimum values detected by comparators 316 and 317 are stored as the path metrics P0 and P1.

An output from any one of the branch metric calculators 301, 302, 303, 304, 306, and 307 and an output from any one of the path metric memories 300 and 305 are added to each other in adders 308, 309, 310, 311, 312, 313, 314, and 315. Outputs from the adders 308, 309, 310, and 311 are compared with each other in the comparator 316 to detect a minimum value of the four inputs. A 2-bit selection signal (index signal) representing a minimum one of the four inputs of the comparator 316 is output to the path memory 56. Outputs from the adders 312, 313, 314, and 315 are compared with each other in the comparator 317 to detect a minimum value. A 2-bit selection signal (index signal) representing a minimum one of the four inputs of the comparator 317 is output to the path memory 56.

The minimum value output from the comparator 316 is written in the path metric memory 300 as the path metric P0. The minimum value output from the comparator 317 is written in the path metric memory 305 as the path metric P1.

When 2-bit digital signals obtained when t=N are represented by $x_N$ and $y_N$, and when path metrics related to "0" and "1" are represented by $P0_N$ and $P1_N$, respectively, a path metric $P0_{N+2}$ obtained when t=N+2 is a minimum one of the following four values and selected by the comparator 316.

$(x_N-(-1))^2+(y_N-(-1))^2+P0_N$ $(x_N-0)^2+(y_N-0)^2+P0_N$ $(x_N-0)^2+(y_N-(-1))^2+P1_N$ $(x_N-1)^2+(y_N-0)^2+P1_N$

Similarly, a path metric $P1_{N+2}$ obtained when t=N+2 is a minimum one of the following values and selected by the comparator 317.

$(x_N-(-1))^2+(y_N-0)^2+P0_N$ $(x_N-0)^2+(y_N-1)^2+P0_N$ $(x_N-0)^2+(y^N-0)^2+P1_N$ $(x_N-1)^2+(y_N-1)^2+P1_N$

As shown in FIGS. 6 and 7, in the radix-4, in comparison with the radix-2, the number of arithmetic units (the branch metric calculator 52, the ACS calculator 54, and the path metric memory 60) increases. The comparator is required to have 4-input comparison instead of 2-input comparison and increases in circuit scale. Since the number of arithmetic units is increased, when a reproduction speed is low, i.e., when a throughput and an operating frequency are low, a leakage current or the like consumed by the increased number of arithmetic units is wasted.

Figure 8:
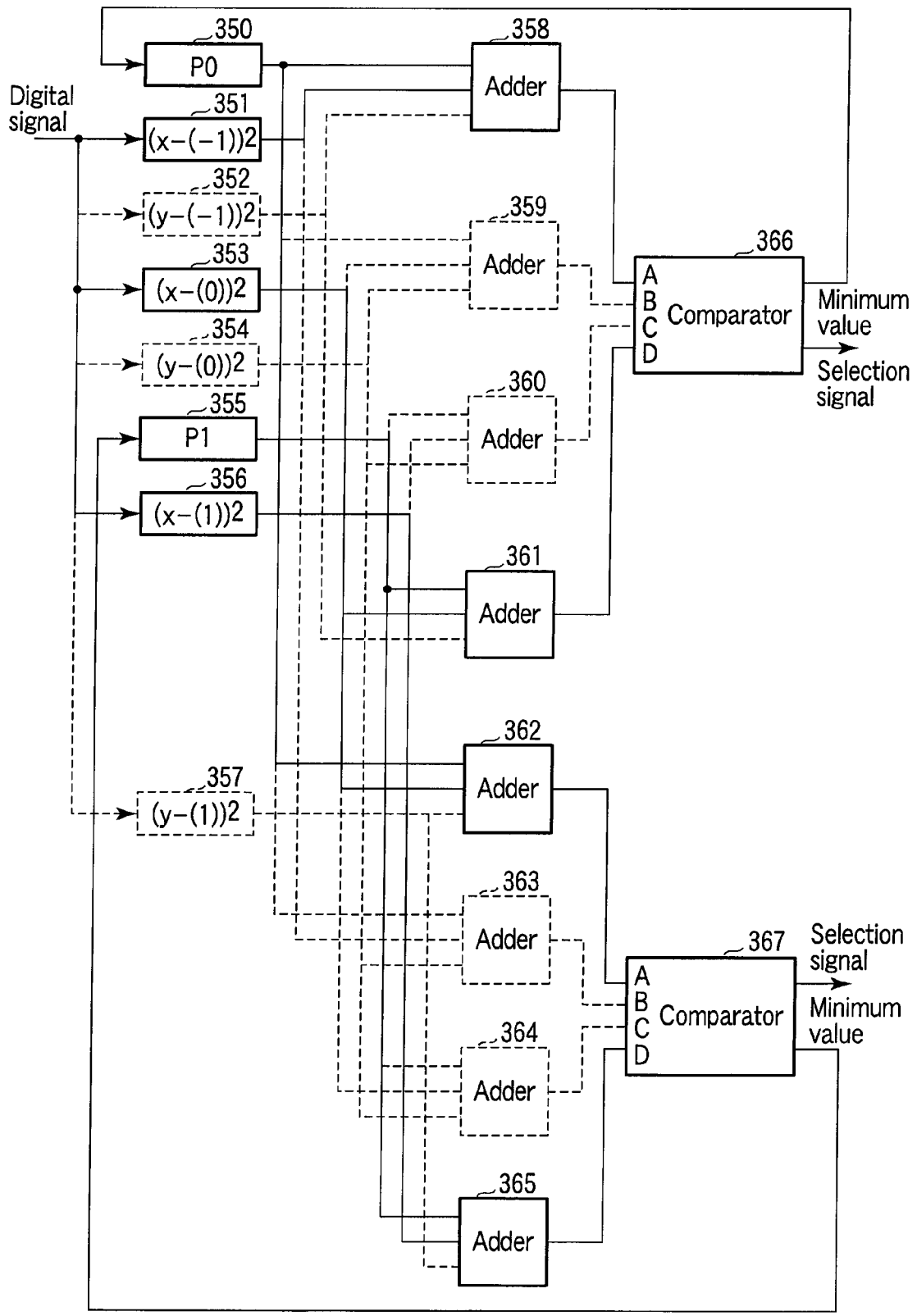
FIG. 8 is an exemplary block diagram showing the configuration of a branch metric calculator which can switch ON/OFF states in a radix-4 mode, addition/comparison/selection circuits, and a path metric memory.

In the embodiment of the invention, a maximum likelihood decoder based on radix-$2^k$ (the kth power of 2: k is a natural number of 2 or more) wherein which a clock switching unit, an input/output value switching circuit, and a power supply cut circuit are provided is proposed. A circuit in the radix-4 is shown in FIG. 8. In FIG. 8, a clock switching function is provided in a portion indicated by a solid line, a power supply cut-off function, an input/output value fixing function, or a clock stopping function is provided in a portion indicated by a broken line. When the circuit portion indicated by the broken line is removed, the circuit in FIG. 8 is the same as the circuit of the radix-2 shown in FIG. 6. When a high throughput is required, operating speeds of the circuit at the portion indicated by the solid line and the circuit at the portion indicated by the broken line are reduced to half a channel frequency. Hereinafter, this operation is called a radix-4-mode-on or simply called a radix-4 mode.

In a low throughput state, the operating speed of the circuit at the portion indicated by the solid line is increased to a channel frequency, a power supply is turned off, the input/output value is fixed, or supply of a clock is stopped with respect to the circuit at the portion indicated by the broken line. Hereinafter, this operation is called a radix-4-mode-off or a radix-2-mode.

When the power supply of the circuit is turned off, not only a dynamic power consumption caused by a through current or the like generated by switching or the like in a CMOS circuit but also a static power consumption caused by a leakage current or the like can be preferably suppressed. However, the power supply may not be able to be turned off, depending on the circuit configuration. In this case, the input/output value is fixed, or the supply of a clock is stopped. When the input/output value of the circuit is set to a fixed value, a through current is eliminated, and a dynamic portion included in the power consumption can be removed. Since the dynamic power consumption can also be suppressed by stopping supply of a clock to an unused circuit, the clock may be stopped.

FIG. 8 is a proposal related to control of operating frequencies of branch metric calculators 351 to 354, 356, and 357, adders 359, 360, 363, and 364, and comparators 366 and 367, and reductions in power consumption thereof. The proposal of reductions in power consumption of the input comparators 366 and 367 shown in FIG. 8 will be described below.

Figure 10:
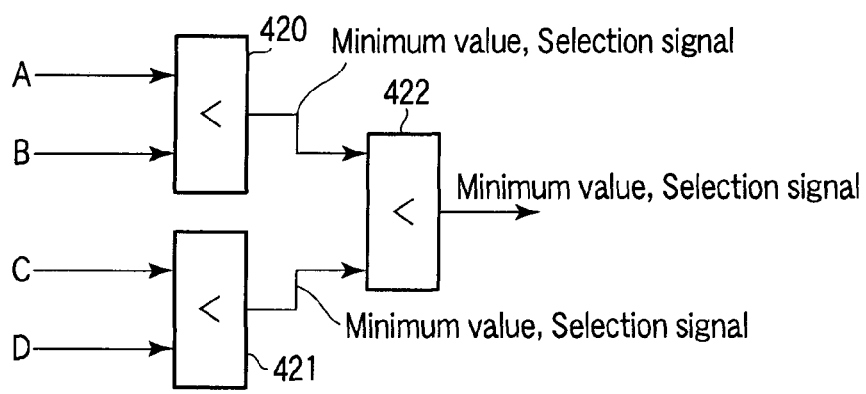
FIG. 10 is an exemplary block diagram showing the configuration of the 4-input comparator in FIG. 9.

FIG. 10 is a diagram showing an illustrative configuration of the 4-input comparators 316 and 317 in FIG. 7. Inputs A and B are supplied to first and second input terminals of a comparator 420, and inputs C and D are supplied to first and second terminals of a comparator 421. The comparator 420 outputs a smaller value of the inputs A and B. When the input A is smaller than the input B, a selection signal "1" is output. When the input A is not smaller than the input B, a selection signal "0" is output. The comparator 421 outputs a smaller value of the inputs C and D. When the input C is smaller than the input D, the selection signal "1" is output. When the input C is not smaller than the input D, the selection signal "0" is output.

Outputs from the comparators 420 and 421 are supplied to first and second input terminals of a comparator 422. The comparator 422 also outputs a smaller value of the first input (minimum value output from the comparator 420) and the second input (minimum value output from the comparator 421). When the first input is smaller than the second input, the selection signal "1" is output. When the first input is not smaller than the second input, the selection signal "0" is output. In this manner, a minimum value of four inputs A, B, C, and D is output from the comparator 422, and a selection signal representing the minimum value is output. The selection signal is "11" when the input A is the minimum value, the selection signal is "01" when the input B is the minimum value, the selection signal is "10" when the input C is the minimum value, and the selection signal is "00" when the input D is the minimum value.

Figure 9:
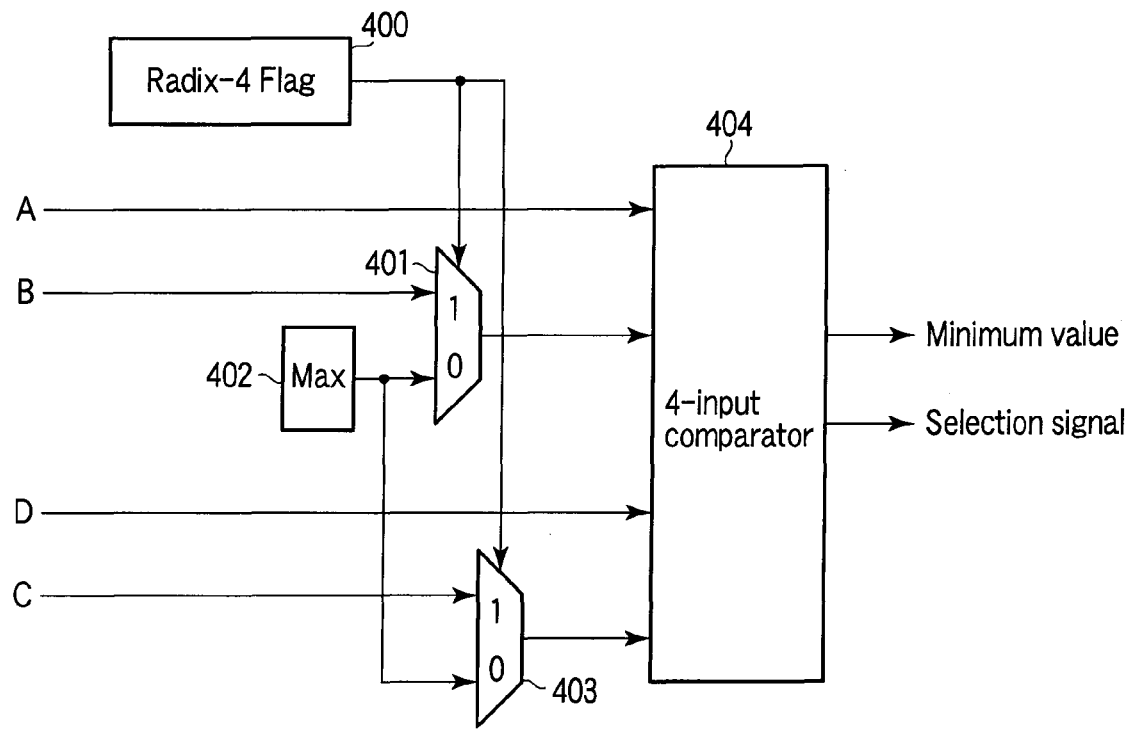
FIG. 9 is an exemplary block diagram showing the configuration of a 4-input comparator which can switch ON/OFF states in the radix-4 mode.

FIG. 9 is an example in which an input value is fixed to reduce a power consumption of an input comparator 404 (for example, shown in FIG. 10). The inputs A and D are supplied to the first input terminal and fourth input terminal of the input comparator 404. The inputs B and C are supplied to "1" input terminals of selectors 401 and 403. A fixed value 402 is supplied to "0" input terminals of the selectors 401 and 403. A radix-4 flag 400 is supplied to control terminals of the selectors 401 and 403. The selectors 401 and 403 output "0" inputs when the control terminals are "0", and output "1" inputs when the control terminals are "1". The outputs from the selectors 401 and 403 are supplied to second and third input terminals of the input comparator 404. The input comparator 404 outputs a minimum value of the first to fourth inputs and a selection signal serving as an index representing the minimum value.

When the radix-4 flag 400 is off (=0), the selectors 401 and 403 output the fixed value 402. When the radix-4 flag 400 is on (=1), the selectors 401 and 403 output inputs B and C. For this reason, in a radix-4-mode-off (flag=0) state, the unnecessary inputs B and C of the comparator 404 are fixed to fixed values, i.e., maximum values. In this manner, a through current is eliminated, and a dynamically consumed part of a power consumption can be reduced.

If outputs from the adders 359, 360, 363, and 364 serving as inputs of the comparators 366 and 367 can be set to fixed values such as the maximum values, a circuit configuration shown in FIG. 9 in which the inputs of the comparators are set to fixed values is unnecessary.

Figure 11A:
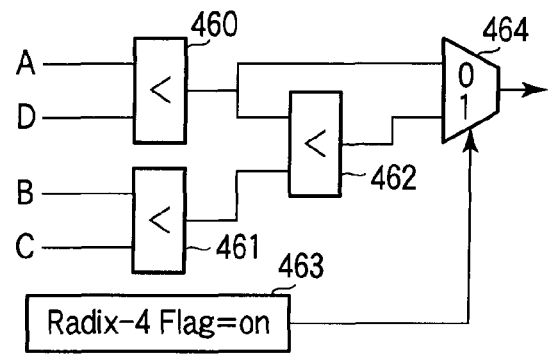
FIGS. 11A and 11B are exemplary block diagrams showing the configurations of 4-input comparators which cut a power supply of an unnecessary circuit when a radix-4 mode is in an off state.
Figure 11B:
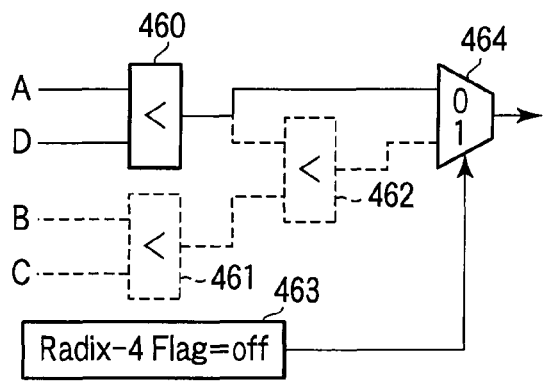

Alternatively, in order to reduce a power consumption of the 4-input comparator 404, the 4-input comparator 404 shown in FIGS. 11A and 11B may be provided. The inputs A and D are supplied to first and second input terminals of a comparator 460, and the inputs B and C are supplied to first and second input terminals of a comparator 461. The comparator 460 outputs a smaller value of the inputs A and D, then outputs a selection signal "1" when the input A is smaller than the input D, or a selection signal "0" when the input A is not smaller than the input D. The comparator 461 outputs a smaller value of the inputs B and C, then outputs the selection signal "1" when the input B is smaller than the input C, or the selection signal "0" when the input B is not smaller than the input C.

The outputs from the comparators 460 and 461 are supplied to first and second input terminals of a comparator 462. The comparator 462 also outputs a smaller value of a first input (minimum value output from the comparator 460) and a second input (minimum value output from the comparator 461), then outputs the selection signal "1" when the first input is smaller than the second input, or the selection signal "0" when the first input is not smaller than the second input. For this reason, the selection signal is "11" when the input A is the minimum value, the selection signal is "01" when the input D is the minimum value, the selection signal is "10" when the input B is the minimum value, and the selection signal is "00" when the input C is the minimum value.

An output from the comparator 460 and an output from the comparator 462 are supplied to a "0" input terminal and a "1" input terminal of a selector 464. The radix-4 flag 463 is supplied to a control terminal of the selector 464. When the radix-4 flag 463 is "1" (radix-4 flag is on), the selector 464, as shown in FIG. 11A, outputs the output from the comparator 462 serving as a "1" input. When the radix-4 flag 463 is "0" (radix-4 flag is off), the selector 464 selects the output from the comparator 460. The comparator 464 outputs the minimum value of the two inputs A and D. An unnecessary portion (comparators 461 and 462) indicated by a broken line in FIG. 11B turns off the power supply, fixes an input/output value, or stops a clock.

Figure 12:
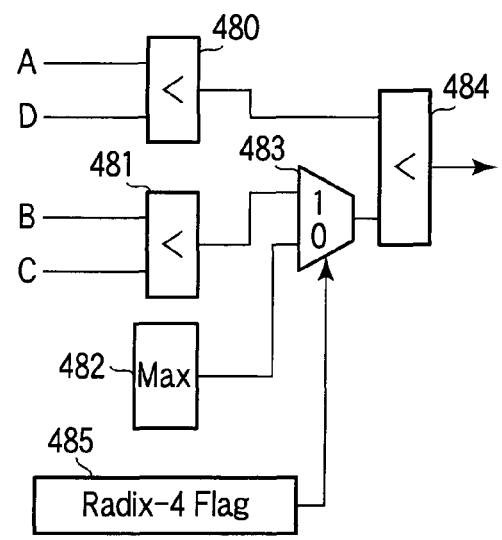
FIG. 12 is an exemplary block diagram showing the configuration of a 4-input comparator which sets an input as a fixed value when the radix-4 mode is an on state.

Alternatively, a four-input comparator as shown in FIG. 12 is provided to output a fixed value. The inputs A and D are supplied to first and second input terminals of a comparator 480, and the inputs B and C are supplied to first and second input terminals of a comparator 481. The comparator 480 outputs a smaller value of the inputs A and D, then outputs a selection signal "1" when the input A is smaller than the input D, or a selection signal "0" when the input A is not smaller than the input D. The comparator 481 outputs a smaller value of the inputs B and C, then outputs the selection signal "1" when the input B is smaller than the input C, or the selection signal "0" when the input B is not smaller than the input C.

The output from the comparator 480 is supplied to a first input terminal of a comparator 484. The output from the comparator 481 and a fixed value (for example, a maximum value) 482 are supplied to a "1" input terminal and a "0" input terminal of a selector 483. A radix-4 flag 485 is supplied to a control terminal of the selector 483. When the radix-4 flag 485 is in the on state, the selector 483 outputs the output from the comparator 481 serving as a "1" input. In the radix-4 mode-off state, the selector 483 outputs the fixed value 482. For this reason, a through current is eliminated, and a dynamically consumed part of a power consumption can be reduced. The output from the selector 483 is supplied to the second input terminal of the comparator 484. The comparator 484 also outputs a smaller value of a first input (minimum value output from the comparator 480) and a second input (output from the selector 483), then outputs the selection signal "1" when the first input is smaller than the second input, or the selection signal "0" when the first input is not smaller than the second input.

FIGS. 9 to 12 show a proposal related to improvement of a 4-input comparator. However, the path memory 56 may be improved. The configuration of the radix-4 path memory 56 in FIG. 2 is shown in FIG. 13. A 2-bit selection signal from the comparator 366 is supplied to control terminals of selectors 504, 508, . . . , 512, and a 2-bit selection signal from the comparator 367 is supplied to control terminals of selectors 505, 509, . . . , 513. A "00" signal 500 is supplied to a "11" input and a "01" input of the selector 504, and a "01" signal 501 is supplied to a "10" input and a "00" input of the selector 504, a "10" signal 502 is supplied to a "11" input and a "01" input of the selector 505, and a "11" signal 503 is supplied to a "10" input and a "00" input of the selector 505.

An output from the selector 504 is supplied to "11" inputs and "10" inputs of the selectors 508 and 509 through a 2-bit flip-flop 506. An output from the selector 505 is supplied to a "01" inputs and a "00" inputs of the selectors 508 and 509 through a 2-bit flip-flop 507. Similarly, outputs from the selectors 508 and 509 are supplied to selectors of the next stage through 2-bit flip-flops 510 and 511. Outputs from the selectors 512 and 513 of the final stage are supplied to the path detection module 58 through 2-bit flop-flops 514 and 515. The path metrics P0 and P1 from the path metric memory 60 are also supplied to the path detection module 58. The path detection module 58 selects and outputs any one of the path metrics P0 and P1 depending on outputs from the flop-flops 514 and 515. The path memory 56 in FIG. 13 operates at a frequency which is half a frequency of a channel rate in the radix-4-mode-on state.

Figure 14:
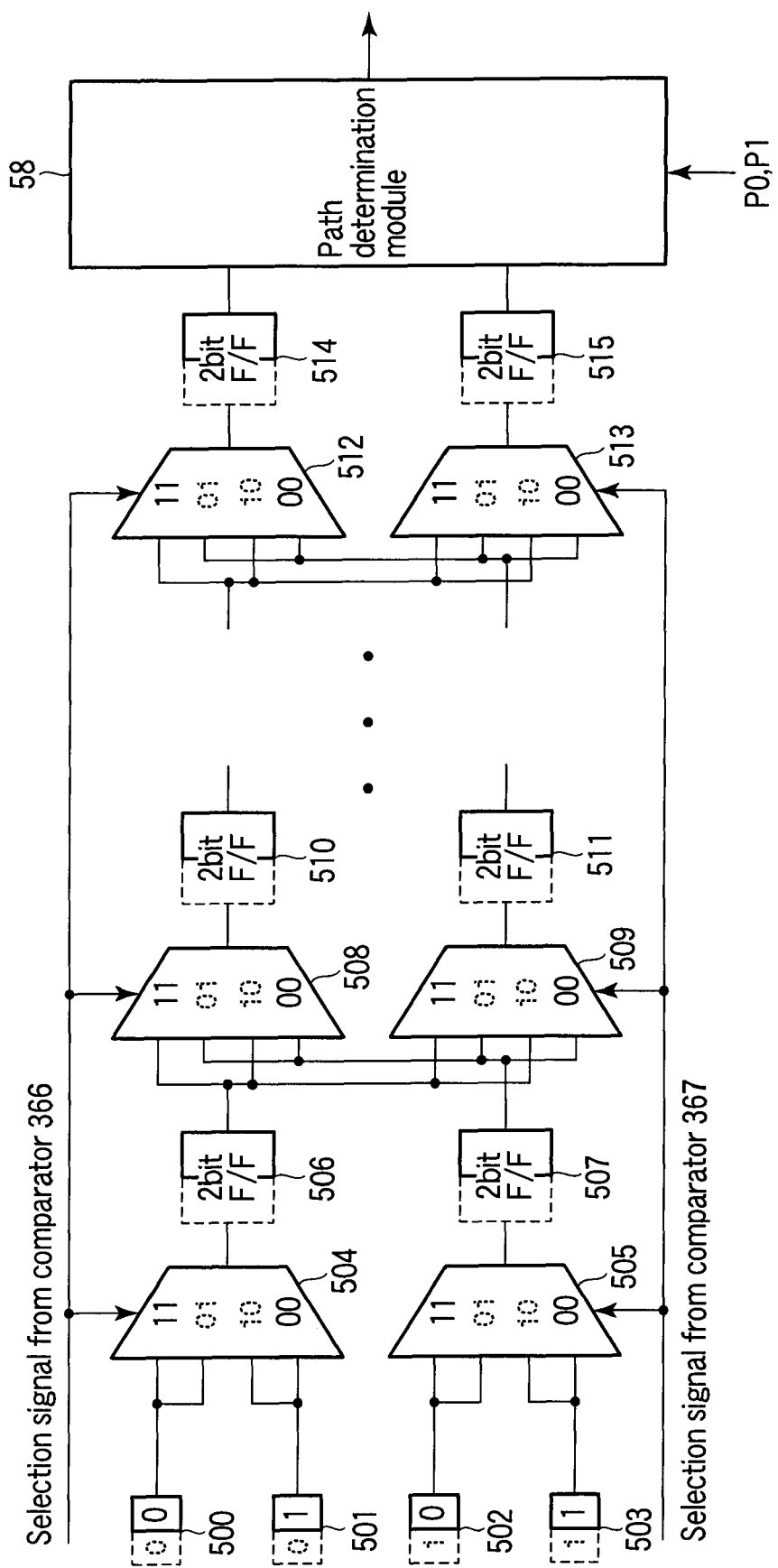
FIG. 14 is an exemplary block diagram showing the configuration of the path memory when the radix-4 mode is in an off state.

A device which turns off the power supply by turning the radix-4 mode on/off may be added to the path memory 56. In the radix-4-mode-off state, the path memory 56 is operated at the frequency of the channel rate to turn off a power supply of a circuit of an upper-1-bit part indicated by a broken line in FIG. 14. Alternatively, a fixed value such as "0" or "1" is set, or supply of a clock is stopped.

As shown in FIGS. 8 to 14, it is possible to reduce a power consumption of a maximum likelihood decoder by adding a means which reduces a power consumption of a useless circuit portion to reduce an operating frequency, according to required throughput, and stopping an operation of an unnecessary circuit. In the radix-4-mode-off state, only a portion indicated by a solid line operates at a channel frequency, and a portion indicated by a broken line operates at a frequency which is half the channel frequency, so that efficient circuit configuration can also be made.

When a radix-4 circuit having a maximum frequency of 200 MHz is formed, a throughput equal to that of a circuit having an operating frequency of 400 MHz can be realized. When a certain throughput (for example, 200 Mbps) is necessary, an operating frequency of 200 MHz is required in the radix-2. However, the operating frequency may be set to 100 MHz, which is half the operating frequency in the radix-4. If the operating frequency is half, the decoder can be easily designed and can be easily manufactured because conventional processes can be used.

On/off switching in the radix-4 mode will be described below with reference to the flow charts shown in FIGS. 15 to 17.

Figure 15:
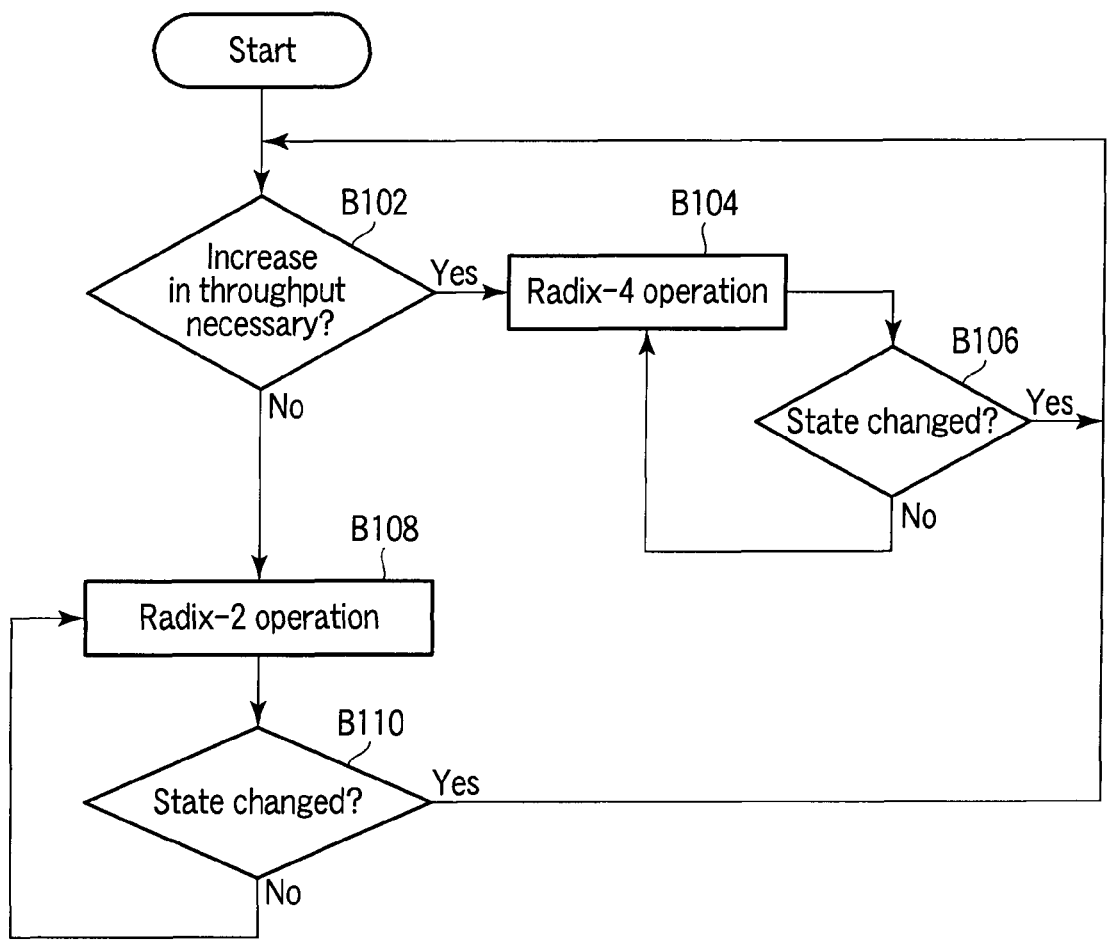
FIG. 15 is an exemplary flow chart showing an ON/OFF switching operation in the radix-4 mode.

The flow chart in FIG. 15 switches on/off states of the radix-4 mode depending on throughputs. In block B102, it is determined whether an increase in throughput according to the present invention is necessary. As described in the conventional art, since a throughput increases when the operating frequency of the circuit is increased, the increase in throughput is generally realized by increasing the operating frequency. However, the increase in operating frequency has an upper limit, therefore, only when the increase in operating frequency is impossible is a throughput increasing process according to the invention performed. When the throughput increasing process is necessary, the radix-4 flag is turned on in block B104 to execute a radix-4 operation (operating frequency is half a frequency of a channel rate). During the radix-4 operation, it is determined in block B106 whether operating states change. The change of the operating states includes a state in which types of disks to be reproduced change (change or the like from a DVD to a CD), a state in which a state of a disk surface changes to change qualities of reproduced signals (defects or stains increase, which deteriorates the decoding performance), and the like. When the state change is detected, the operation returns to block B102.

When the throughput increasing process is unnecessary, the radix-4 flag is turned off in block B108 to execute a radix-2 operation (operating frequency is a channel rate frequency). During the radix-2 operation, it is determined in block B110 whether states change. The change of the operating states includes a state in which types of disks change (change or the like from a CD to a DVD), a state in which a state of a disk surface changes (scratches or stains decrease to improve decoding performance), and the like. When the state change is detected, the operation returns to block B102.

In this manner, when a throughput which exceeds an operating frequency limit of the circuit is necessary, a radix-4 operation is performed, and, otherwise, the radix-2 operation is performed. In comparison with the radix-2 operation, in the radix-4 operation, an operating frequency required to realize the same throughput becomes half, an amount of calculation per unit time doubles, and therefore, a circuit scale increases. However, when the operating frequency becomes half, the following merits can be obtained. That is, a condition of manufacturing processes with respect to an operating speed can be advantageously moderated, a degree of difficulty in designing a circuit decreases, and a manufacturing yield increases in terms of a circuit operating speed. When the radix-2/radix-4 switching is performed, a balance between an operating speed and a power consumption can be obtained, and a maximum likelihood decoder which copes with a high throughput and maintains a balance with a reduction in power consumption is realized.

A flow chart in FIG. 16 is obtained by adding improvement of decoding performance to the flow chart in FIG. 15 as a criterion for switching the radix-2/radix-4 operations. When a state of read data is poor, a latency of a circuit is reduced to increase a response speed of the circuit, and in order to improve the decoding performance, detection for switching is added to perform the radix-2 operation.

As shown in FIG. 5, data is input in a 2-bit parallel manner in the radix-4 circuit. For this reason, serial/parallel conversion is necessary, a latency of the circuit increases, and the response speed of the circuit becomes low. As shown in FIG. 1, in Viterbi decoding, a decoding result is fed back to a coefficient controller 25 and the defect detector 44. When the decoding result is fed back to a coefficient learning means, data having a shaped waveform does not pose a problem even though a response speed is low. However, when data considerably changes due to a poor disk state, decoding performance is deteriorated by decreasing a response speed. In variable-speed reproduction (in particular, high-multi-speed reproduction), when a disk state is poor due to scratches, stains, and the like, a data state considerably changes.

Since high-speed tracking is required for a state change of data, high-speed response of a circuit is desired. However, since high-speed tracking cannot be performed when a latency increases, decoding performance is deteriorated. For this reason, the latency is reduced in preference to a reduction in operating speed when decoding performance is pursued. In a good disk state, an operating speed or a power consumption is preferentially reduced. If the radix-4 is to increase a throughput, a response speed (related to decoding performance) is sacrificed to obtain this. In terms of a power consumption, when a circuit operation is slow, a power consumption decreases.

More specifically, it is determined in block B114 whether improvement of decoding performance is necessary. When the improvement of decoding performance is necessary, the radix-4 flag is turned off in block B116 to execute a radix-2 operation. During the radix-2 operation, it is determined in block B118 whether the states change. The state change includes a state in which types of disks change (change or the like from a CD to a DVD), a state in which a reproduction state of a disk surface changes (influence of scratches or stains decreases to improve decoding performance), and the like. When a state change is detected, the operation returns to block B114.

When the improvement of decoding performance is not necessary, as in the flow chart in FIG. 15, it is determined in block B102 whether an increase in throughput according to the invention is necessary. When an increasing process is necessary, the radix-4 flag is turned on in block B104 to execute the radix-4 operation. During the radix-4 operation, it is determined in block B106 whether states change. When a state change is detected, the operation returns to block B114.

When the throughput increasing process is not necessary, the radix-4 flag is turned off in block B108 to execute the radix-2 operation. During the radix-2 operation, it is determined in block B110 whether states change. When a state change is detected, the operation returns to block B114.

In this manner, when a state of a read signal is poor, decoding performance is improved in preference to the pursuit of an increase in throughput.

Figure 17:
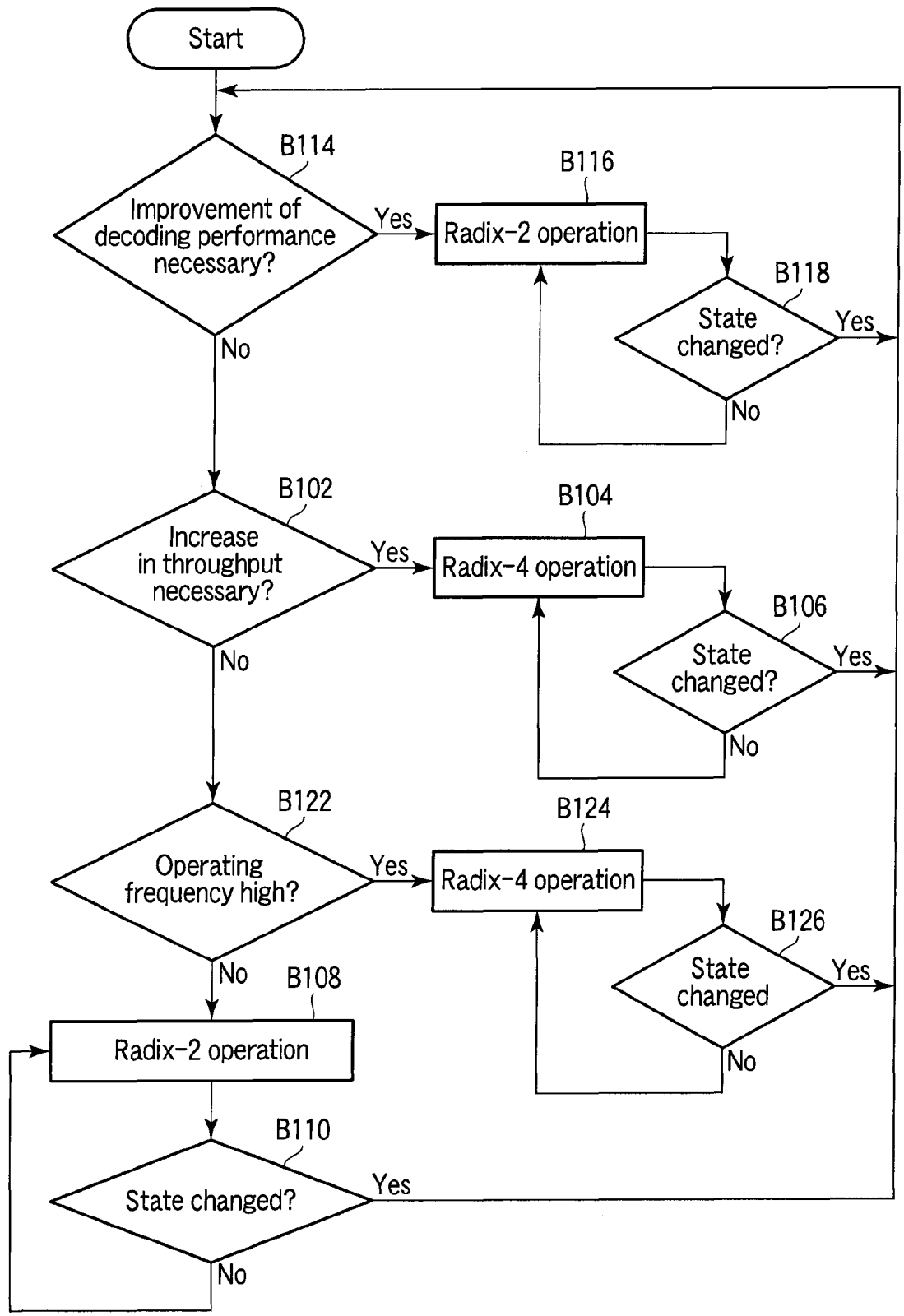
FIG. 17 is an exemplary flow chart showing an ON/OFF switching operation in the radix-4 mode.

A flow chart in FIG. 17 is obtained by adding an operating frequency to the flow chart in FIG. 16 as a criterion for switching the radix-2/radix-4 operations. When it is determined in block B102 that the increase in throughput is not necessary, it is determined in block B122 whether an operating frequency is higher than a predetermined frequency. When the operating frequency is higher than the predetermined frequency, a clock frequency is reduced, and the radix-4 flag is turned off in block B108 to execute the radix-2 operation, in order to reduce a circuit operating speed. During the radix-2 operation, it is determined in block B110 whether the states change. When a state change is detected, the operation returns to block B114. When the operating frequency is not higher than the predetermined frequency, the radix-4 flag is turned on block B124 to execute the radix-4 operation. During the radix-4 operation, it is determined in block B126 whether the states change. When a state change is detected, the operation returns to block B114.

In this manner, a maximum likelihood decoder which maintains a balance between improvement of decoding performance, an increase in throughput, and a reduction in power consumption can be realized.

The configuration and operational effects of the maximum likelihood decoder described in the embodiment will be summarized as follows.

When a high throughput is required as in high-multi-speed reproduction of a DVD, reproduction of a Blu-ray disk, or the like, all the arithmetic units and storage units are utilized to decrease the operating speed to half or less of the operating speed, so that a power consumption is kept at a low level. An operating frequency required to achieve a throughput is reduced to make it possible to increase a manufacturing yield and decrease a degree of difficulty of circuit design.

On the other hand, when a throughput is low as in reproduction of a CD, a power consumption can be reduced by switching the frequency to a frequency almost equal to a channel rate frequency, reducing the numbers of operated arithmetic units and operated storage units, reducing an electric power consumed in an unused circuit, or turning off a power supply for the unused circuit.

In this manner, a maximum likelihood decoder which has an efficiency higher than that of a conventional art in terms of a power consumption in a low-throughput state to a high-throughput state, which maintains a balance between an increase in throughput and decoding performance, and which can cope with an increase in throughput can be realized.

According to the invention, a maximum likelihood decoder which has an efficiency higher than that of a conventional art in terms of a power consumption in a low-throughput state to a high-throughput state and which can cope with an increase in throughput without deteriorating the decoding performance can be realized.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The various modules of the systems described herein can be implemented as software applications, hardware and/or software modules, or components on one or more computers, such as servers. While the various modules are illustrated separately, they may share some or all of the same underlying logic or code. The accompanying claims and their equivalents are intended to cover such forms or modifications as would fall within the scope and spirit of the inventions.

What is claimed is:

1. A maximum likelihood decoder comprising:
    a branch metric calculator configured to calculate a branch metric;
    an addition-comparison-selection circuit configured to perform addition, comparison, and selection of an output from the branch metric calculator and a path metric in order to update the path metric, and to output a selection signal for identifying a selection result;
    a path memory configured to store a time variation of the selection signal; and
    a path determination module configured to determine a path as a decoding signal based on the time variation of the selection signal stored in the path memory, wherein
    at least one of the branch metric calculator, the addition-comparison-selection circuit, and the path memory is able to be switched between a radix-2 mode in which an operation is performed at a channel rate frequency and a radix-4 mode in which an operation is performed at a specific frequency lower than the channel rate frequency, the number of operations per a time in the radix-4 mode is twice the number of operations per the time in the radix-2 mode, and the specific frequency is half the channel rate frequency.

2. The maximum likelihood decoder of claim 1, wherein said at least one of the branch metric calculator, the addition-comparison-selection circuit, and the path memory comprises a first circuit portion which operates at the channel rate frequency in the radix-2 mode and a second circuit portion which executes at least one of cutting-off of a power supply, fixing of an input/output value, and stopping of a clock in the radix-2 mode, and the first circuit portion and the second circuit portion operate at the specific frequency in the radix-4 mode.

3. The maximum likelihood decoder of claim 1, further comprising a switching module configured to switch the radix-2 mode and the radix-4 mode, wherein
the switching module selects the radix-4 mode when an increase in throughput is necessary.

4. The maximum likelihood decoder of claim 1, further comprising a switching module configured to switch the radix-2 mode and the radix-4 mode, wherein
the switching module selects the radix-2 mode when improvement of decoding performance is necessary.

5. The maximum likelihood decoder of claim 1, further comprising a switching module configured to switch the radix-2 mode and the radix-4 mode, wherein
the switching module selects the radix-4 mode when an operating frequency is higher than a predetermined frequency.

6. A decoding method for a maximum likelihood decoder comprising:
a branch metric calculator configured to calculate a branch metric;
a addition-comparison-selection circuit configured to perform addition, comparison, and selection of an output from the branch metric calculator and a path metric in order to update the path metric, and to output a selection signal for identifying a selection result;
a path memory configured to store a time variation of the selection signal; and
a path determination module configured to determine a path as a decoding signal based on the time variation of the selection signal stored in the path memory, the method comprising:
selecting operation modes of at least one of the branch metric calculator, the addition-comparison-selection circuit, and the path memory switch between a radix-2 mode in which an operation is performed at a channel rate frequency and a radix-4 mode in which an operation is performed at a specific frequency lower than the channel rate frequency, wherein
the number of operations per a time in the radix-4 mode is twice the number of operations per the time in the radix-2 mode, and
the specific frequency is half the channel rate frequency.

7. The decoding method of claim 6, wherein said at least one of the branch metric calculator, the addition-comparison-selection circuit, and the path memory comprises a first circuit portion which operates at the channel rate frequency in the radix-2 mode and a second circuit portion which executes at least one of cutting-off of a power supply, fixing of an input/output value, and stopping of a clock in the radix-2 mode, and the first circuit portion and the second circuit portion operate at the specific frequency in the radix-4 mode.

8. The decoding method of claim 6, wherein the selecting comprises selecting the radix-4 mode when an increase in throughput is necessary.

9. The decoding method of claim 6, wherein the selecting comprises selecting the radix-2 mode when improvement of decoding performance is necessary.

10. The decoding method of claim 6, wherein the selecting comprises selecting the radix-4 mode when an operating frequency is higher than a predetermined frequency.

11. An optical disk device comprising:
an equalizing module configured to equalize a waveform of a reproduced digital signal from an optical disk depending on a characteristic of a recording-reproduction system;
a control module configured to control a waveform equalization characteristic of the equalizing module; and
a Viterbi decoder module configured to decode an output digital signal of the equalizing module, wherein the Viterbi decoder module comprises:
a branch metric calculator configured to calculate a branch metric;
an addition-comparison-selection circuit configured to perform addition, comparison, and selection of an output from the branch metric calculator and a path metric to update the path metric, and outputs a selection signal for identifying a selection result;
a path memory which stores a time variation of the selection signal; and
a path determination module configured to determine a path as a decoding signal based on the time variation of the selection signal stored in the path memory, wherein
at least any one of the branch metric calculator, the addition-comparison-selection circuit, and the path memory is able to be switched between a radix-2 mode in which an operation is performed at a channel rate frequency and a radix-4 mode in which an operation is performed at a specific frequency lower than the channel rate frequency,
the number of operations per a time in the radix-4 mode is twice the number of operations per the time in the radix-2 mode, and
the specific frequency is half the channel rate frequency.

12. The optical disk device of claim 11, wherein said at least one of the branch metric calculator, the addition-comparison-selection circuit, and the path memory comprises a first circuit portion which operates at the channel rate frequency in the radix-2 mode and a second circuit portion which executes at least one of cutting-off of a power supply, fixing of an input/output value, and stopping of a clock in the radix-2 mode, and the first circuit portion and the second circuit portion operate at the specific frequency in the radix-4 mode.

* * * * *